(12) United States Patent
Cao

(10) Patent No.: US 9,804,457 B2
(45) Date of Patent: *Oct. 31, 2017

(54) FLEXIBLE PRINTED CIRCUIT BOARD AND LIQUID CRYSTAL DISPLAY

(71) Applicant: Shenzhen China Star Optoelectronics Technology Co., Ltd., Shenzhen, Guangdong (CN)

(72) Inventor: Hongrui Cao, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 182 days.

This patent is subject to a terminal disclaimer.

(21) Appl. No.: 14/437,826

(22) PCT Filed: Jan. 12, 2015

(86) PCT No.: PCT/CN2015/070522
§ 371 (c)(1),
(2) Date: Apr. 22, 2015

(87) PCT Pub. No.: WO2016/106827
PCT Pub. Date: Jul. 7, 2016

(65) Prior Publication Data
US 2016/0349553 A1    Dec. 1, 2016

(30) Foreign Application Priority Data
Dec. 31, 2014   (CN) .......................... 2014 1 0856646

(51) Int. Cl.
*G02F 1/1345*    (2006.01)
*H05K 1/02*    (2006.01)
(Continued)

(52) U.S. Cl.
CPC ........ *G02F 1/1345* (2013.01); *G02F 1/13458* (2013.01); *H05K 1/0253* (2013.01);
(Continued)

(58) Field of Classification Search
CPC ...... H05K 1/0296; H05K 1/0253; H05K 1/09; H05K 2201/09727; H05K 2201/094;
(Continued)

(56) References Cited

U.S. PATENT DOCUMENTS 4,586,789 A    5/1986  Kishimoto et al.
7,630,048 B2 * 12/2009  Hong .................... G02F 1/1345
                                                                    349/149

(Continued)

FOREIGN PATENT DOCUMENTS

CN    102548207 A    7/2012
CN    202524647 U    11/2012
(Continued)

*Primary Examiner* — Jia Pan
(74) *Attorney, Agent, or Firm* — Andrew C. Cheng

(57) ABSTRACT

The disclosure is related to a flexible printed circuit board. The flexible printed circuit board comprises a connecting area and a plurality of gold fingers disposed inside the connecting area, wherein the widths of the gold fingers are different. By the above manner, the disclosure is able to increase the number of the gold fingers without changing the size of the flexible printed circuit board so as to solve the impedance matching problem of the gold fingers of the flexible printed circuit board.

4 Claims, 3 Drawing Sheets

(51) Int. Cl.
*H05K 1/11* (2006.01)
*H05K 1/09* (2006.01)

(52) U.S. Cl.
CPC .................. *H05K 1/09* (2013.01); *H05K 1/11* (2013.01); *G02F 1/13452* (2013.01); *H05K 1/028* (2013.01); *H05K 1/117* (2013.01); *H05K 2201/05* (2013.01); *H05K 2201/10136* (2013.01)

(58) Field of Classification Search
CPC .......... H05K 1/028; H05K 1/11; H05K 1/118; H05K 1/189; H05K 3/361; H05K 2201/05; H05K 1/0393; H05K 2201/2009; H05K 1/117; H05K 1/0295; H05K 2201/09954; H05K 2201/09145; H05K 3/363; H05K 2201/097; G02F 1/133; Y10T 29/49124; H01L 23/4985; H01R 12/721
See application file for complete search history.

(56) References Cited

U.S. PATENT DOCUMENTS

| | | | | |
|---|---|---|---|---|
| 2004/0036833 | A1* | 2/2004 | Monzen | G02F 1/13452 349/158 |
| 2006/0248179 | A1* | 11/2006 | Short | H04L 63/1416 709/223 |
| 2007/0097309 | A1* | 5/2007 | Matsumoto | G02F 1/13452 349/149 |
| 2007/0197058 | A1* | 8/2007 | Kitada | H05K 3/363 439/76.2 |
| 2008/0084530 | A1* | 4/2008 | Hirabayashi | H01R 13/025 349/150 |
| 2008/0102653 | A1* | 5/2008 | Adulami | H05K 1/117 439/59 |
| 2009/0147204 | A1* | 6/2009 | Kang | G02F 1/13452 349/150 |
| 2010/0035446 | A1 | 2/2010 | Lo et al. | |
| 2013/0093990 | A1* | 4/2013 | Chen | H05K 1/117 349/150 |
| 2013/0306360 | A1* | 11/2013 | Tan | H01L 23/4985 174/254 |

FOREIGN PATENT DOCUMENTS

| | | |
|---|---|---|
| CN | 202565573 U | 11/2012 |
| CN | 104540315 A | 4/2015 |
| JP | H05145209 A | 6/1993 |
| JP | H09246676 A | 9/1997 |
| WO | WO2008078427 A | 7/2008 |

* cited by examiner

FLEXIBLE PRINTED CIRCUIT BOARD AND LIQUID CRYSTAL DISPLAY

BACKGROUND

Technical Field

The disclosure is related to liquid crystal technology field, and more particular to a flexible printed circuit board and a liquid crystal display using the same.

Related Art

With the development of technology, the liquid crystal displays (LCD) have been used in public life. In order to satisfy the requirement, the resolution of the liquid crystal displays are increased gradually, such as the resolution of the liquid crystal displays from qHD (Quarter High Definition, the screen resolution of a digital product) to HD (High Definition), or that from WXGA (Wide Extended Graphics Array, widescreen) to WUXGA (Widescreen Ultra eXtended Graphics Array). Increase of the resolution of the LCDs have consequently doubled the number of differential lines, such that the number of the gold fingers of the flexible printed circuit board must be increased.

However, the size of the flexible printed circuit board is fixed. In order to increase the resolution of the liquid crystal display, it is necessary to increase the number of gold fingers on the flexible printed circuit board. Nevertheless, in order to satisfy to increase the number of the gold fingers, the size of the flexible printed circuit board must be increased. It is easy to increase the cost. Additionally, since the gold fingers of the flexible printed circuit board are increased, it must affect the impedance of the gold finger area. Therefore, with increase of the resolution of the liquid crystal display, the impedance matching of the gold finger area has become a major problem.

In summary, it is desirous to provide a flexible printed circuit board and a liquid crystal display to solve the above problem.

SUMMARY

The technique problem solved by the disclosure is to provide a flexible printed circuit board and a liquid crystal display which is able to increase the number of the gold fingers without changing the size of the flexible printed circuit board so as to solve the impedance matching problem of the flexible printed circuit board effectively.

In order to solve the above technique problem, the disclosure provides a flexible printed circuit board which comprises a connecting area and a plurality of gold fingers separately disposed inside the connecting area, wherein the widths of the gold fingers are different; the distances between the adjacent gold fingers are different; the gold fingers comprises first gold fingers for transmitting differential signals and second gold fingers for transmitting other signals beside the differential signals; wherein the widths of the first gold fingers are greater than the widths of the second gold fingers.

In one embodiment, the gold fingers are aligned with each other and arranged on the connecting area.

In order to solve the above technique problem, the disclosure further provides a flexible printed circuit board which comprises the flexible printed circuit board comprising a connecting area and a plurality of gold fingers separately disposed inside the connecting area, wherein the widths of the gold fingers are different.

In one embodiment, the gold fingers comprises first gold fingers for transmitting differential signals and second gold fingers for transmitting other signals beside the differential signals; wherein the widths of the first gold fingers are greater than the widths of the second gold fingers.

In one embodiment, the first gold fingers are located on a center region or two sides of the connecting area.

In one embodiment, the first gold fingers are staggered and arranged on the connecting area, and the second gold fingers are staggered and arranged on the connecting area.

In one embodiment, the distances between the adjacent gold fingers are different.

In one embodiment, the gold fingers comprises first gold fingers for transmitting differential signals and second gold fingers for transmitting other signals beside the differential signals, wherein the distances between the adjacent first gold fingers are greater than distances between the adjacent second gold fingers or the distances between the first gold fingers and the second gold fingers adjacent to the first gold fingers.

In one embodiment, the first gold fingers are located on the two sides of the connecting area.

In one embodiment, the first gold fingers are staggered and arranged on the connecting area, the second gold fingers are staggered and arranged on the connecting area.

In one embodiment, the distances of the gold finger are increased gradually from a center region to two sides of the connecting area.

In order to solve the above technique problem, the disclosure further provides a liquid crystal display which comprises a liquid crystal panel and a flexible printed circuit board connected to the liquid crystal panel, the flexible printed circuit board comprising a connecting area and a plurality of gold fingers separately disposed inside the connecting area, wherein the widths of the gold fingers are different.

In one embodiment, the gold fingers comprises first gold fingers for transmitting differential signals and second gold fingers for transmitting other signals beside the differential signals; wherein the widths of the first gold fingers are greater than the widths of the second gold fingers.

In one embodiment, the first gold fingers are located on a center region or two sides of the connecting area.

In one embodiment, the first gold fingers are staggered and arranged on the connecting area, and the second gold fingers are staggered and arranged on the connecting area.

In one embodiment, the distances between the adjacent gold fingers are different.

In one embodiment, the gold fingers comprises first gold fingers for transmitting differential signals and second gold fingers for transmitting other signals beside the differential signals, wherein the distances between the adjacent first gold fingers are greater than the distances between the adjacent second gold fingers or the distances between the first gold fingers and the second gold fingers adjacent to the first gold fingers.

In one embodiment, the first gold fingers are located on the two sides of the connecting area.

In one embodiment, the first gold fingers are staggered and arranged on the connecting area, and the second gold fingers are staggered and arranged on the connecting area.

In one embodiment, the distances of the gold finger are increased gradually from the center region to the two sides of the connecting area.

The advantageous effects of the disclosure distinguishing from the current technique is that the flexible printed circuit board of the disclosure comprises a connecting area and a plurality of gold fingers disposed inside the connecting area, wherein the widths of the gold fingers are different. By the above manner, the disclosure configures the widths of the gold fingers of the flexible printed circuit board to be different such that it is able to increase the gold fingers without changing the size of the flexible printed circuit board so as to solve the impedance matching problem of the gold fingers of the flexible printed circuit board.

BRIEF DESCRIPTION OF THE DRAWINGS

The above and other exemplary aspects, features and advantages of certain exemplary embodiments of the present disclosure will be more apparent from the following description taken in conjunction with the accompanying drawings, in which.

DETAILED DESCRIPTION

The description and explanation are given in more details in the following with reference to the accompanying drawings.

Figure 1:
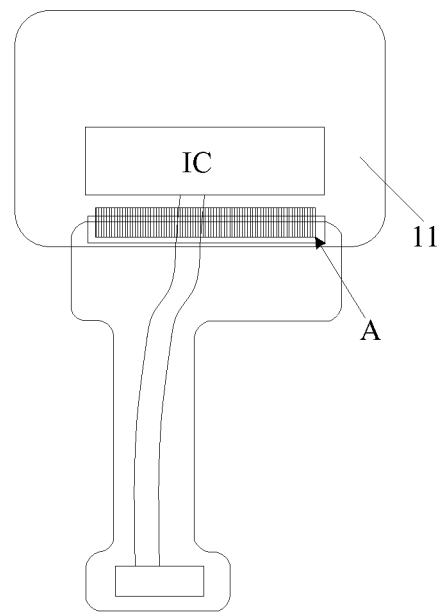
FIG. 1 is a schematic view of the flexible printed circuit board and the liquid crystal display according to the embodiment of the disclosure.
Figure 2:
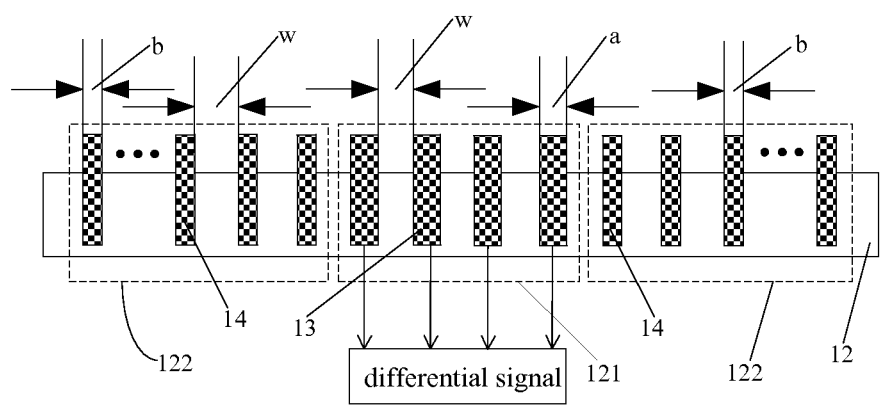
FIG. 2 is a schematic view of the first embodiment of area A in FIG. 1.

As shown in FIGS. 1 and 2, FIG. 1 is a schematic view of the flexible printed circuit board and the liquid crystal display according to the embodiment of the disclosure, and FIG. 2 is a schematic view of the first embodiment of area A in FIG. 1. The disclosure provides a liquid crystal display. The liquid crystal display comprises a liquid crystal panel 11 and a flexible printed circuit board. The liquid crystal panel 11 is connected to the flexible printed circuit board. The flexible printed circuit board comprises a connecting area 12, and a plurality of gold fingers separately disposed inside the connecting area 12. The gold fingers are used to transmit signals.

The connecting area 12 comprises a first area 121 and a second area 122. The gold comprises fingers include first gold fingers 13 and second gold fingers 14. The first gold fingers 13 are disposed on the first area 121, and the second gold fingers 14 are disposed on the second area 122. The first gold fingers 13 are used to transmit differential signals, and the second gold fingers 14 are used to transmit other signals besides the differential signals. In this embodiment, the gold fingers are aligned with each other and arranged on the connecting area 12, i.e. the first gold fingers 13 are aligned with each other and arranged on the first area 121, and the second gold fingers 14 are aligned with each other and arranged on the second area 122.

In this embodiment, the widths of the gold fingers are different, i.e. the width of each of the gold fingers is set to be different according to the importance of the signal transmitted by each of the gold fingers. In one embodiment, the higher the importance of the transmitted signals, the wider the widths of the gold fingers. In this embodiment, the importance of the differential signals is higher, and the importance of the other signals beside the differential signals is lower. Hence the widths a of the first gold fingers 13 are greater than the widths b of the second gold fingers 14. It should be understood that the all widths of the first gold fingers 13 disposed on the first area 121 are a, the all widths of the second gold fingers 14 disposed on the second area 122 are b, and the distances between the gold fingers are w, i.e. the all distances between the first gold fingers 13 disposed on the first area 121 are w, and the all distances between the second gold fingers 14 disposed on the second area 122 are w, too.

In other embodiments, it should be understood that the highest importance of the differential signals is not limitative. The highest importance of the signals is determined mainly according to a layout of signal transmitting lines inside the practical flexible printed circuit board.

It should be understood that the first gold fingers 13 may located on the center region of the connecting area 12, and may also be located on the two sides of the connecting area 12, i.e. the first gold fingers 13 are not only located on the first area 121, but also located on the second area 122 or other areas.

In this embodiment, the widths of the first gold fingers 13 located on the center region of the connecting area 12 do not change, and then the widths of the second gold fingers 14 are decreased to obtain enough distances on the two sides of the connecting area 12, so as to increase or modify the gold fingers on the two sides of the connecting area 12 for solving the impedance matching problem of the flexible printed circuit board.

Figure 3:
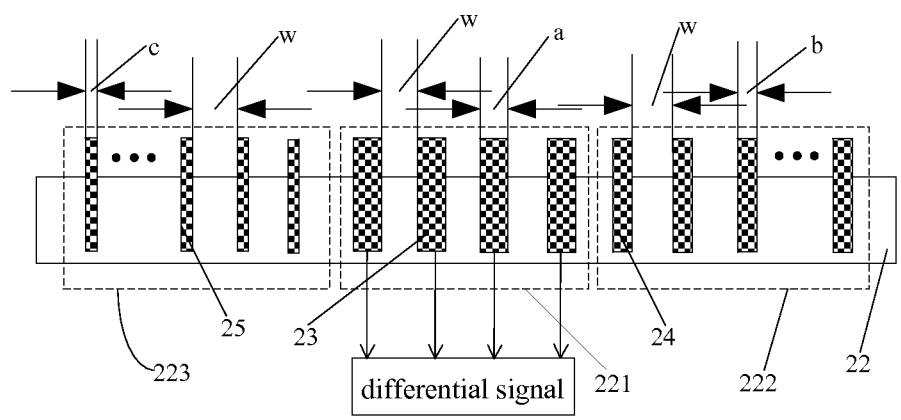
FIG. 3 is a schematic view of the second embodiment of area A in FIG. 1.

Further, as shown in FIG. 3, FIG. 3 is a schematic view of the second embodiment of area A in FIG. 1. The difference between FIG. 2 and FIG. 3 is that the widths of the gold fingers are increased or decreased gradually according to the importance of each of the transmitted signal of the gold fingers. Namely, the connecting area 22 comprises a first area 221, a second area 222 and a third area 223. The gold fingers comprise first gold fingers 23, second gold fingers 24 and third gold fingers 25. The first gold fingers 23 are disposed on the first area 221, the second gold fingers 24 are disposed on the second area 222, and the third gold fingers 25 are disposed on the third area 223. The first gold fingers 23 are used to transmit differential signals, the second gold fingers 24 are used to transmit first signals, and the third gold fingers 25 are used to transmit second signals. In this embodiment, the gold fingers are aligned with each other and arranged on the connecting area 22, i.e. the first gold fingers 23 are aligned with each other and arranged on the first area 221, the second gold fingers 24 are aligned with each other and arranged on the second area 222, and the third gold fingers 25 are aligned with each other and arranged on the third area 225.

In this embodiment, the importance of the differential signals is high, the importance of the first signals is medium, and the importance of the second signals is low. Therefore, the widths a of the first gold fingers 23 are greater than the widths b of the second gold fingers 24, the widths b of the second gold fingers 24 are greater than the widths c of the third gold fingers 24. In one embodiment, the widths a of the first gold fingers 23, the widths b of the second gold fingers 24 and the widths c of the third gold fingers 25 are decreased gradually or the widths a of the first gold fingers 23, the widths b of the second gold fingers 24 and the widths c of the third gold fingers 25 are determined by using arithmetic progression. Additionally, the distances between the first gold fingers 23, the distances between the second gold fingers 24, and the distances between the third gold fingers 25 are w.

In other embodiments, it should be understood that the high importance of the differential signals, the medium importance of the first signals and the low importance of the second signals insides the flexible printed circuit board is not limitative. The importance of the signals are determined mainly according to a layout of signal transmitting lines insides the practical flexible printed circuit board, i.e. the importance of the first signals may also be high, or the importance of the second signals may also be high. Additionally, the first gold fingers 23 may be located on the first area 221, or the first gold fingers 23 may also be located on the second area 222.

In this embodiment, the widths a of the first gold fingers 23, the widths b of the second gold fingers 24 and the widths c of the third gold fingers 25 are decreased gradually to solve the impedance matching problem of the flexible printed circuit board; meanwhile, since the widths of the adjacent gold fingers are determined by gradual increase or decrease, the sizes of the widths of the adjacent gold fingers are controlled better and the process efficiency may increase effectively.

Figure 4:
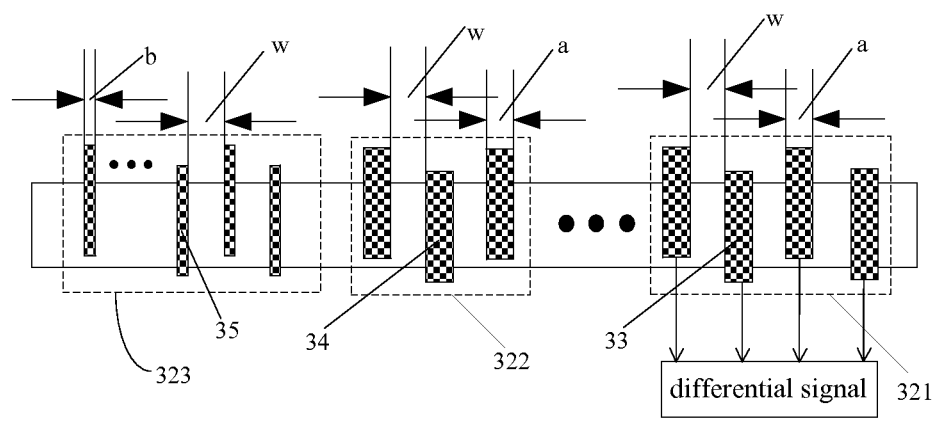
FIG. 4 is a schematic view of the third embodiment of area A in FIG. 1.

As shown in FIG. 4, FIG. 4 is a schematic view of the third embodiment of area A in FIG. 1. The difference between FIG. 4 and FIG. 2 is that the widths of the highest importance of the gold fingers and the widths of the lowest importance of the gold fingers re set to be different and the gold fingers are staggered and arranged on the connecting area 32. Specifically, the connecting area 32 comprises a first area 321, a plurality of second area 322 and a third area 323. The gold fingers include first gold fingers 33, second gold fingers 34 and third gold fingers 35. The first gold fingers 33 are staggered and arranged on the first area 321. The second gold fingers 34 are staggered and arranged on the second areas 322. The third gold fingers 35 are staggered and arranged on the third area 323. The first gold fingers 33 are used to transmit differential signals, the second gold fingers 34 are used to transmit first signals, and the third gold fingers are used to transmit second signals.

In this embodiment, the importance of the differential signals are highest, the importance of the second signals are lowest. Therefore, the widths a of the first gold fingers 33 are greater than the widths b of the third gold fingers 35. In one 15 embodiment, the widths a of the first gold fingers 33 is proportional to the widths b of the third gold fingers 35, i.e. the widths a of the first gold fingers 33 are a multiple of the widths b of the third gold fingers 35. Additionally, the widths a of the first gold fingers 33 are equal to the widths a of the second gold fingers 34 on the second areas 322; meanwhile, the distances between the first gold fingers 33, the distances between 20 the second gold fingers 34 and the distances between the third gold fingers 35 are w.

In other embodiment, it should be understood that the highest importance of the differential signals and the lowest importance of the second signals is not limitative. The highest importance and the lowest importance of the signals are determined mainly according to a layout of the signal transmitting lines insides the practical flexible printed circuit board, i.e. the highest importance of the signals may be the first signals, the highest importance of the signals may also be the third signals according the layout of the practical flexible printed circuit board.

In this embodiment, the widths of the highest importance of the gold fingers and the widths of the lowest importance of the gold fingers are set to be different to solve the impedance matching problem of the flexible printed circuit board; meanwhile, since only the highest importance of the widths of the gold fingers and the lowest importance of the width of the gold fingers are set, the sizes of the widths of the adjacent gold fingers are controlled better and the process efficiency may increase effectively. Additionally, the gold fingers are staggered and arranged to provide more space between the gold fingers so as to decrease the interference between the adjacent gold fingers.

Figure 5:
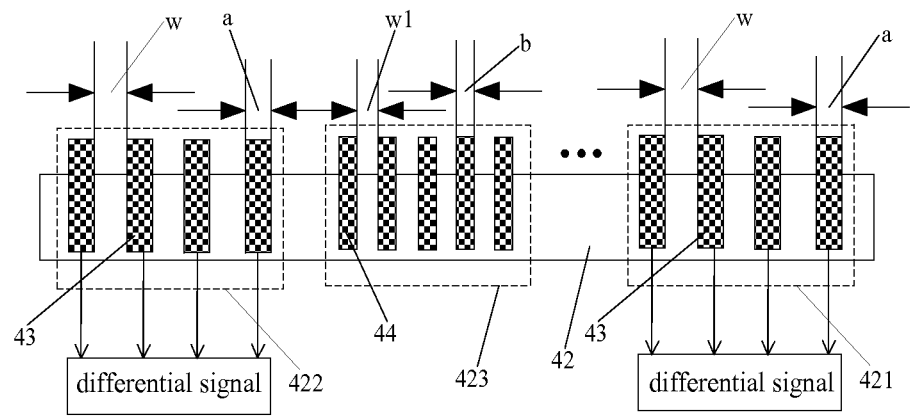
FIG. 5 is a schematic view of the fourth embodiment of area A in FIG. 1.

As shown in FIG. 5, FIG. 5 is a schematic view of the fourth embodiment of area A in FIG. 1. The difference between FIG. 5 and FIG. 2 is that the widths of the gold fingers are different, and the distances between the adjacent gold fingers are different.

In one embodiment, the distances between of the gold fingers adjacent to each other are set to be different according the importance of each of the transmitted signals of the gold fingers; meanwhile, the widths of the fingers are also set to be different according to the importance of the signals transmitted by the gold fingers. The higher the importance of the transmitted signals, the wider the distances between the gold fingers adjacent with each other and the wider the widths of the gold fingers.

The gold fingers comprises first gold fingers 43 for transmitting differential signals and second gold fingers 44 for transmitting other signals beside the differential signals. The connecting area 42 comprises a first area 421, a second area 422 and a third area 423. The first gold fingers 43 are disposed on the first area 421 and the second area 422, i.e. the first gold fingers 43 are located on the two sides of the connecting area 42, the second gold fingers 44 are disposed on the third area 423. In this embodiment, the gold fingers are aligned with each other and arranged on the connecting area 42, i.e. the first gold fingers 43 are aligned with each other and arranged on the first area 421 and the second area 422, the second gold fingers 44 are aligned with each other and arranged on the third area 423.

In this embodiment, the importance of the differential signals are higher, the importance of other signals beside the differential signals are lower. In one embodiment, the distances between the adjacent gold fingers are increased gradually from the center region to the two sides of the connecting area 42. Therefore, the distances w between the adjacent first gold fingers 43 are greater than the distances w1 between the adjacent second gold fingers 44 or the distances w between the adjacent first gold fingers 43 are greater than the distances between the first gold fingers 43 and the second gold fingers 44 adjacent to the first gold fingers 43; meanwhile, the widths a of the first gold fingers 43 are greater than the width b of the second gold fingers 44. In one embodiment, the widths a of the first gold fingers 43 is proportional to the widths b of the second gold fingers 44, i.e. the widths a of the first gold fingers are 1.5 times, 2 times, 3 times or more times of the widths b of the second gold fingers 44; the distances w between the first gold fingers 43 is proportional to the distances w1 of the second gold fingers 44, i.e. the distances w of the first gold fingers are 1.5 times, 2 times, 3 times or more times of the distances w1 of the second gold fingers 44.

In other embodiments, it should be understood that the first gold fingers 43 may be disposed on the first area 421, and the second gold fingers 44 are disposed on the second area 422 and the third area 423. Or the first gold fingers 43 may be disposed on the third area 423; the second gold fingers 44 are disposed on the first area 421 and the second area 422.

The disclosure set the distances between the gold fingers and the widths of the gold finger to be different at the same time to make the flexible printed circuit board to have enough space, so as to greatly increase the assembling yield of the flexible printed circuit board.

Figure 6:
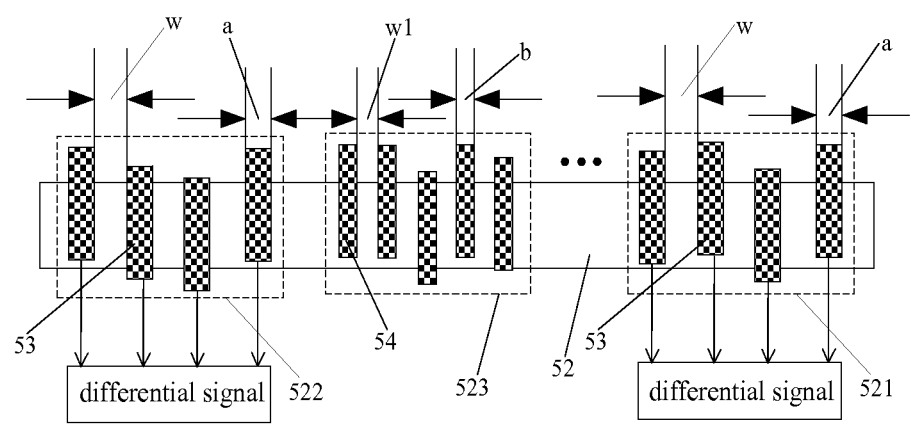
FIG. 6 is a schematic view of the fifth embodiment of area A in FIG. 1.

As shown in FIG. 6, FIG. 6 is a schematic view of the fifth embodiment of area A in FIG. 1. The difference between FIG. 6 and FIG. 5 is that the gold fingers are staggered and arranged on the connecting area 52, i.e. the first gold fingers 53 are staggered and arranged on the first area 521 and the second area 522, and the second gold fingers 54 are staggered and arranged on the second area 522.

In summary, according to the disclosure, the flexible printed circuit board comprises a connecting area and a plurality of gold fingers disposed inside the connecting area, wherein the widths of the gold fingers are different. It is able to set the widths of the gold fingers of the flexible printed circuit board to be different, and it is also able to set the distances between the gold fingers of the flexible printed circuit board to be different at the same time, such that the number of the gold finger may increase without changing the size of the flexible printed circuit board to solve impedance matching problem of the gold fingers of the flexible printed circuit board effectively.

Note that the specifications relating to the above embodiments should be construed as exemplary rather than as limitative of the present disclosure. The equivalent variations and modifications on the structures or the process by reference to the specification and the drawings of the disclosure, or application to the other relevant technology fields directly or indirectly should be construed similarly as falling within the protection scope of the disclosure.

What is claimed is:

1. A flexible printed circuit board, comprising:
a connecting area and a plurality of gold fingers separately disposed inside the connecting area;
wherein the plurality of gold fingers comprise first gold fingers for transmitting differential signals and second gold fingers for transmitting other signals different from the differential signals, a width of each of the first gold fingers is greater than a width of each of the second gold fingers while a distance between each neighboring two of the first gold fingers is the same as a distance between each neighboring two of the second gold fingers; and wherein the first gold fingers are located on the center region of the connecting area.

2. The flexible printed circuit board according to claim 1, wherein the plurality of gold fingers are aligned with each other and arranged on the connecting area.

3. A flexible printed circuit board, comprising a connecting area and a plurality of gold fingers separately disposed inside the connecting area, wherein the plurality of gold fingers comprise first gold fingers for transmitting a first type signal and second gold fingers for transmitting a second type signal with an importance level different from that of the first type signal, a width of each of the first gold fingers is different from a width of each of the second gold fingers while a distance between each neighboring two of the first gold fingers is the same as a distance between each neighboring two of the second gold fingers; the higher the importance level of the transmitted signal, the wider the width of the gold finger is;
wherein the first type signal is differential signals and the second type signal is other signals different from the differential signals, the importance level of the differential signals is higher than the importance level of the other signals and correspondingly the width of each of the first gold fingers is greater than the width of each of the second gold fingers; and
wherein the first gold fingers are located on the center region of the connecting area.

4. A liquid crystal display, wherein the liquid crystal display comprises a liquid crystal panel and a flexible printed circuit board connected to the liquid crystal panel, the flexible printed circuit board comprising a connecting area and a plurality of gold fingers separately disposed inside the connecting area, wherein the plurality of gold fingers comprise first gold fingers for transmitting a first type signal and second gold fingers for transmitting a second type signal with an importance level different from that of the first type signal, a width of each of the first gold fingers is different from a width of each of the second gold fingers while a distance between each neighboring two of the first gold fingers is the same as a distance between each neighboring two of the second gold fingers; the higher the importance level of the transmitted signal, the wider the width of the gold finger is;
wherein the first type signal is differential signals and the second type signal is other signals different from the differential signals, the importance level of the differential signals is higher than the importance level of the other signals and correspondingly the width of each of the first gold fingers is greater than the width of each of the second gold fingers; and
wherein the first gold fingers are located on the center region of the connecting area.

* * * * *